(12) United States Patent
Choo et al.

(10) Patent No.: US 7,330,136 B2
(45) Date of Patent: Feb. 12, 2008

(54) METHOD AND DEVICE TO PROVIDE ARITHMETIC DECODING OF SCALABLE BSAC AUDIO DATA

(75) Inventors: Kihyun Choo, Seoul (KR); Junghoe Kim, Seoul (KR); Eunmi Oh, Seongnam-si (KR); Changyong Son, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/538,501

(22) Filed: Oct. 4, 2006

(65) Prior Publication Data

US 2007/0115153 A1    May 24, 2007

(30) Foreign Application Priority Data

Oct. 6, 2005    (KR) ............... 10-2005-0093906

(51) Int. Cl.
*H03M 7/34*    (2006.01)
(52) U.S. Cl. ............................ 341/51; 341/50
(58) Field of Classification Search ............ 341/106, 341/50, 51, 65, 107; 381/22, 23; 700/904
See application file for complete search history.

(56) References Cited

U.S. PATENT DOCUMENTS 6,504,496 B1 * 1/2003 Mesarovic et al. ......... 341/106
6,529,604 B1 * 3/2003 Park et al. ..................... 381/22
2005/0180586 A1 * 8/2005 Kim et al. .................. 381/106

* cited by examiner

Primary Examiner—Brian Young
(74) Attorney, Agent, or Firm—Stanzione & Kim, LLP

(57) ABSTRACT

A method and device to arithmetically decode scalable bit sliced arithmetic coding (BSAC) audio data are provided. The arithmetic decoding method includes checking whether all side information of a last layer of the BSAC audio data is to be decoded, and performing BSAC smart decoding and terminating the decoding when all the side information of the last layer is not decoded, and terminating decoding of the last layer when all the side information of the last layer is decoded. The BSAC smart decoding includes checking whether a symbol to be decoded is determined regardless of data read after the truncated bitstream, continuing the decoding when decoding can be performed regardless of data read after the truncated bitstream, and determining that ambiguity occurs and terminating the decoding, when the symbol to be decoded is determined dependent on the data read after the truncated bitstream. Accordingly, byte level scalability can be provided in a MPEG-4 BSAC decoder. Even though the bitstream is truncated, the decoding termination time can be known, and additional decoding with respect to a truncated portion of the bitstream can be performed.

15 Claims, 8 Drawing Sheets

FIG. 3 (PRIOR ART)

```
int ac_decode_symbol (ac_coder *ac, int freq)
{
  long range;
  long cum;
  int sym;
  int i;

range = (long)(ac->high-ac->low)+1;
  cum = ((long)((ac->value-ac->low)+1)<<PRE_SHT);
  if (cum<(range)*freq+1)
  {
 sym = 1;
  ac->high = ac->low + (range*freq>>PRE_SHT)-1;
  }
  else
  {
 sym = 0;
    ac->low = ac->low + (range*freq>>PRE_SHT);
  } for (;;) {
    if (ac->high<HALF_VALUE) {
      /* do nothing */
    } else if (ac->low>=HALF_VALUE) {
      ac->value -= HALF_VALUE;
      ac->low -= HALF_VALUE;
      ac->high -= HALF_VALUE;
    } else if (ac->low>=QTR_VALUE && ac->high<TRDQTR_VALUE) {
      ac->value -= QTR_VALUE;
      ac->low -= QTR_VALUE;
      ac->high -= QTR_VALUE;
    } else
      break;
    ac->low = 2*ac->low;
    ac->high = 2*ac->high+1;
    ac->value = 2*ac->value + input_bit(ac);
  } return sym;
}
```

FIG. 9

ORIGINAL SAMPLES

| MSB | 0 | 0 | 0 | 1 | 0 | 0 | 0 | 0 | 0 |
|---|---|---|---|---|---|---|---|---|---|
| | 1 | 1 | 0 | 0 | 0 | 0 | 1 | 0 | 0 |
| | 1 | 0 | 0 | 0 | 0 | 0 | 0 | 0 | 1 |
| | 0 | 0 | 0 | 0 | 0 | 1 | 1 | 0 | 1 |
| | 0 | 0 | 0 | 1 | 0 | 1 | 1 | 1 | 0 |
| | 0 | 0 | 1 | 1 | 1 | 1 | 0 | 0 | 0 |
| LSB | 0 | 0 | 1 | 1 | 0 | 0 | 0 | 0 | 1 |

48 32 3 71 2 14 44 4 25

DECODED RESULT IN CONVENTIONAL METHOD

| MSB | 0 | 0 | 0 | 1 | 0 | 0 | 0 | 0 | 0 |
|---|---|---|---|---|---|---|---|---|---|
| | 1 | 1 | 0 | 0 | 0 | 0 | 1 | 0 | 0 |
| | 1 | 0 | 0 | 0 | 0 | 0 | 0 | 0 | 1 |
| | 0 | X | X | X | X | X | X | X | X |
| | X | X | X | X | X | X | X | X | X |
| | X | X | X | X | X | X | X | X | X |
| LSB | X | X | X | X | X | X | X | X | X |

48 32 0 64 0 0 32 0 16

DECODED RESULT IN METHOD OF PRESENT GENERAL INVENTIVE CONCEPT

| MSB | 0 | 0 | 0 | 1 | 0 | 0 | 0 | 0 | 0 |
|---|---|---|---|---|---|---|---|---|---|
| | 1 | 1 | 0 | 0 | 0 | 0 | 1 | 0 | 0 |
| | 1 | 0 | 0 | 0 | 0 | 0 | 0 | 0 | 1 |
| | 0 | 0 | 0 | 0 | 0 | 1 | 1 | X | X |
| | X | X | X | X | X | X | X | X | X |
| | X | X | X | X | X | X | X | X | X |
| LSB | X | X | X | X | X | X | X | X | X |

ADDITIONALLY DECODED SYMBOLS 48 32 0 64 0 8 40 0 16

METHOD AND DEVICE TO PROVIDE ARITHMETIC DECODING OF SCALABLE BSAC AUDIO DATA

CROSS-REFERENCE TO RELATED APPLICATIONS

This application claims priority under 35 U.S.C. §119(a) from Korean Patent Application No. 10-2005-0093906, filed on Oct. 6, 2005, in the Korean Intellectual Property Office, the disclosure of which is incorporated herein in its entirety by reference.

BACKGROUND OF THE INVENTION

1. Field of the Invention

The present general inventive concept relates to scalable audio data decoding, and more particularly, to a method and device to provide arithmetic decoding of scalable bit sliced arithmetic coded (BSAC) audio data.

2. Description of the Related Art

Audio lossless encoding is frequently used for audio broadcasting or archiving. Lossless audio encoding is generally performed using an entropy coder using a time/frequency transformation or linear prediction.

When scalability is used in bitstream re-parsing, a bitstream corresponding to one frame may be truncated at any location at a server level and transmitted to a decoder. Accordingly, it is difficult to decode scalable bitstreams which have been truncated.

FIG. 1 is a flowchart illustrating a conventional arithmetic decoding method. First, initialization is performed (operation 100), and then a search is performed for a symbol to be decoded (operation 110). A probability of the symbol is calculated using a context (operation 120), and arithmetic decoding is performed (operation 130). Then, it is checked whether the symbol is the end of a bitstream (operation 140). When the symbol is determined not to be the end of the bitstream, the aforementioned operations are repeated to search for the symbol to be decoded, and when the symbol is determined to be the end of the bitstream, decoding is completed. In the arithmetic decoding, an entire symbol to be decoded or a predetermined bitstream length should be known, or a decoder is provided with information on when to terminate the decoding by inserting a specific termination code. However, as illustrated in FIG. 2, when the bitstream is truncated, since the information is truncated, the symbol or the termination code cannot be found and the decoder does not know when to terminate the decoding. Thus, undesired data may be decoded.

Bit Sliced Arithmetic Coding (BSAC) is a popular Moving Picture Experts Group (MPEG)-4 standard for scalable audio coding which is used widely in digital audio (e.g., digital audio streaming or audio on demand), internet streaming, and Digital Media Broadcasting (DMB). MPEG-4 BSAC offers good sound quality at bit rates between 40 kbps to 64 kbps, but allows for degradation at lower bit rates. In MPEG-4 BSAC, the above truncation problem is even more severe since scalability with units of 1 kbps/ch (i.e., 1 kbps/mono or 2 kbps/stereo) is provided using side information. This results in poor decoding efficiency, especially at lower bit rates.

SUMMARY OF THE INVENTION

The present general inventive concept provides a method and device to arithmetically decode scalable BSAC data in which decoding is efficiently terminated without a decoding error.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a method of arithmetic decoding of scalable bit sliced arithmetic coding (BSAC) audio data, the method including checking whether all side information of a last layer of the BSAC audio data is decoded, and performing BSAC smart decoding and terminating the decoding when all the side information of the last layer is decoded, and terminating the decoding of the last layer when all the side information of the last layer is not decoded. The BSAC smart decoding may include checking whether a symbol to be decoded can be determined regardless of data read after a truncated bitstream, continuing the decoding when the decoding can be performed regardless of the data read after the truncated bitstream, and determining that ambiguity occurs and terminating the decoding, when the symbol to be decoded is determined to be dependent on the data read after the truncated bitstream.

Determining that the ambiguity occurs and terminating decoding may include determining that the ambiguity occurs when the symbol to be decoded is determined depending on the data read after the truncated bitstream, and setting the previously decoded sample to 0 and terminating the decoding when it is determined that the ambiguity occurs with respect to a sign bit.

The BSAC smart decoding in the performing BSAC smart decoding and terminating the decoding may include performing arithmetic decoding using a symbol to be decoded and a probability of the symbol, decoding the symbol into 1 by calculating K and determining whether K is equal to or greater than $2^{dummy}-1$, wherein K is equal to right side values of Inequalities 1 and 2, K, and otherwise, decoding the symbol into 0 when K is equal to or less than 0, $$v2 < \frac{(high - low + 1) \cdot freq}{2^{14}} - v1 + low - 1 \qquad \text{Inequality 1}$$

$$v2 \geq \frac{(high - low + 1) \cdot freq}{2^{14}} - v1 + low - 1 \qquad \text{Inequality 2}$$

wherein, v1 is a valid bitstream value remaining after truncation, v2 is a bitstream value truncated after truncation, dummy is a number of bits of v2, freq is a probability value of the symbol, high and low are upper and lower ends of a range in which the probability value of the symbol exists, and stopping decoding by determining that the ambiguity occurs when K is between 0 and $2^{dummy}-1$.

Before the checking whether all of the side information of the last layer of the BSAC audio data is to be decoded may further include calculating a number of available layers of the BSAC audio data by referring to a target bitrate, and checking whether a BSAC audio data layer to be decoded is the last layer and performing BSAC arithmetic decoding when the BSAC audio data layer to be decoded is not the last layer.

The foregoing and/or other aspects of the present general inventive concept may also be achieved by providing a device to arithmetically decode scalable BSAC audio data, the device including a side information checker to check whether all side information of a last layer of BSAC audio data is decoded, a smart decoder to perform BSAC smart decoding and to terminate the decoding when all the side information of the last layer is decoded, and a decoding terminator to terminate decoding of the last layer when all the side information of the last layer is not decoded.

The smart decoder may continue the BSAC smart decoding when the symbol to be decoded can be decoded regardless of data read after the truncated bitstream by checking whether the symbol to be decoded is determined regardless of the data read after the truncated bitstream, and otherwise, terminates BSAC smart decoding by determining that an ambiguity occurs when the symbol to be decoded is determined to be dependent on the data read after the truncated bitstream.

The smart decoder may include a symbol decoder to perform arithmetic decoding using the symbol to be decoded and a probability of the symbol, an ambiguity checker to check whether an ambiguity occurs by calculating K, wherein K is equal to right side values of Inequalities 1 and 2, $$v2 < \frac{(\text{high} - \text{low} + 1) \cdot \text{freq}}{2^{14}} - v1 + \text{low} - 1 \quad \text{Inequality 1}$$

$$v2 \geq \frac{(\text{high} - \text{low} + 1) \cdot \text{freq}}{2^{14}} - v1 + \text{low} - 1 \quad \text{Inequality 2}$$

an additional decoder to decode the symbol into 1, when K is equal to or greater than $2^{dummy}-1$, and otherwise, decoding the symbol into 0, when K is equal to or less than 0, and a decoding stopper to stop the decoding by determining that the ambiguity occurs, when K is between 0 and $2^{dummy}-1$.

The decoding stopper may determine that the ambiguity occurs, when K is between 0 and $2^{dummy}-1$, and sets a previously decoded sample to 0.

The BSAC audio data arithmetic decoding device may further include a layer number calculator to calculate a number of available layers of the BSAC audio data by referring to a target bitrate, a last layer checker to check whether the BSAC audio data layer to be decoded is the last layer, and a BSAC arithmetic decoder to perform BSAC arithmetic decoding when the BSAC audio data layer is not the last layer based on the checking result.

The foregoing and/or other aspects of the present general inventive concept may also be achieved by providing a method of arithmetically decoding scalable BSAC (bit sliced arithmetic coding) audio data, the method including calculating a number of layers of the BSAC audio data based on a target bit rate, determining whether a BSAC audio data layer to be decoded is a last layer and performing BSAC arithmetic decoding when the BSAC audio data layer to be decoded is not the last layer, checking whether all side information of a last layer of the BSAC audio data is decoded when the BSAC audio data layer to be decoded is determined to be the last layer, and performing BSAC smart decoding and then terminating the decoding when all the side information of the last layer is decoded, otherwise terminating the decoding of the last layer when all the side information of the last layer is not decoded.

The performing the BSAC smart decoding may include arithmetically decoding a symbol of the BSAC audio data, determining a probability of the symbol, determining if an ambiguity occurs in the arithmetically decoded symbol based on the probability of the symbol, stopping decoding if an ambiguity is determined to occur, and determining a symbol value to be 1 or 0 if an ambiguity is determined not to occur.

The foregoing and/or other aspects of the present general inventive concept may also be achieved by providing a method of decoding a bitstream of BSAC (bit sliced arithmetic coding) audio data, the method including determining whether all side information of the bitstream of BSAC audio data is decoded, smart decoding the bitstream of BSAC audio data when all the side information is decoded, the smart decoding including arithmetically decoding a symbol of the bitstream, determining a probability of the symbol, determining if an ambiguity occurs in the arithmetically decoded bitstream symbol based on the probability of the symbol, stopping decoding if an ambiguity is determined to occur, and determining a bitstream symbol value if an ambiguity is determined not to occur.

The foregoing and/or other aspects of the present general inventive concept may also be achieved by providing a computer-readable recording medium having embodied thereon a computer program to execute a method of arithmetic decoding of scalable BSAC (bit sliced arithmetic coding) audio data, the method including checking whether all side information of a last layer of the BSAC audio data is decoded, and performing BSAC smart decoding and terminating the decoding when all the side information of the last layer is decoded, and terminating the decoding of the last layer when all the side information of the last layer is not decoded, wherein the BSAC smart decoding includes checking whether a symbol to be decoded can be determined regardless of data read after a truncated bitstream, continuing decoding when decoding can be performed regardless of the data read after the truncated bitstream, and determining that an ambiguity occurs and terminating the decoding, when the symbol to be decoded is determined to be dependent on the data read after the truncated bitstream.

The foregoing and/or other aspects of the present general inventive concept may also be achieved by providing a computer-readable recording medium having embodied thereon a computer program to execute a method of decoding of BSAC (bit sliced arithmetic coding) audio data, the method including calculating a number of layers of the BSAC audio data based on a target bit rate, determining whether a BSAC audio data layer to be decoded is a last layer and performing BSAC arithmetic decoding when the BSAC audio data layer to be decoded is not the last layer, checking whether all side information of a last layer of the BSAC audio data is decoded when the BSAC audio data layer to be decoded is determined to be the last layer, and performing BSAC smart decoding and terminating the decoding when all the side information of the last layer is decoded, and terminating the decoding of the last layer when all the side information of the last layer is not decoded.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 3 illustrates pseudo code for conventional binary arithmetic decoding;

FIG. 9 illustrates an example in which additional decoding is performed by using a method of determining whether arithmetic decoding of a scalable BSAC bitstream is continuously performed or terminated.

DETAILED DESCRIPTION OF THE PREFERRED EMBODIMENTS

Figure 1:
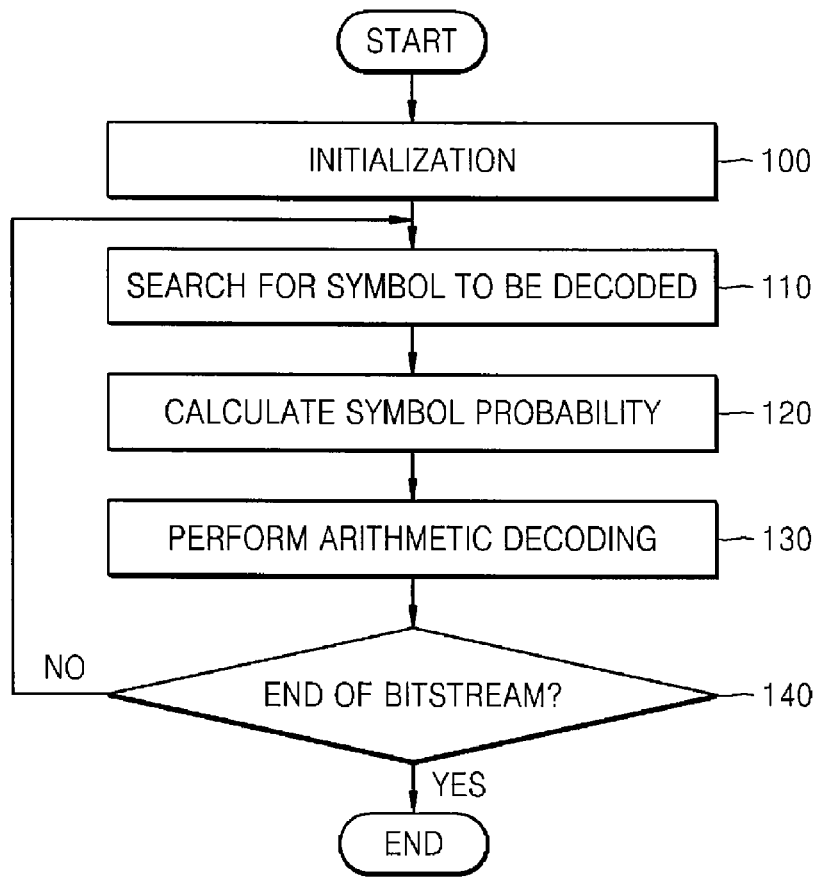
FIG. 1 is a flowchart illustrating a conventional arithmetic decoding method.
Figure 2:
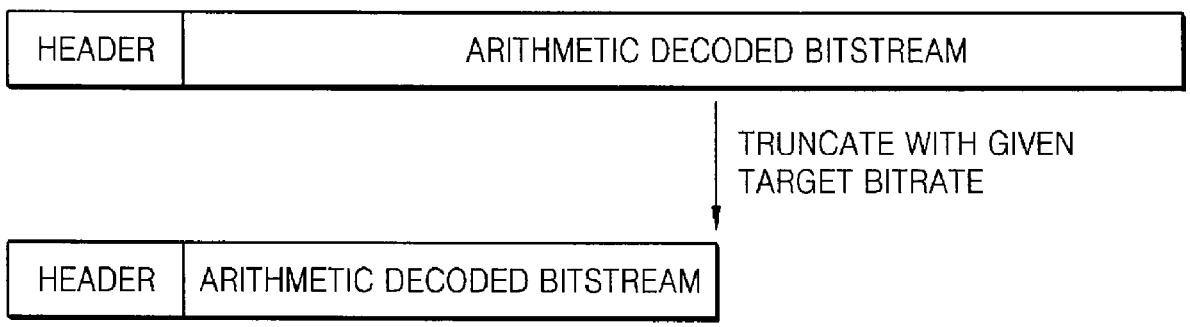
FIG. 2 illustrates bitstream truncation for general scalability.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 3 illustrates pseudo code used in conventional binary arithmetic decoding. According to the pseudo code illustrated in FIG. 3, at first, a symbol decoded by using current high or low frequency values is determined, and then the high or low frequency values are rescaled and updated.

Figure 4:
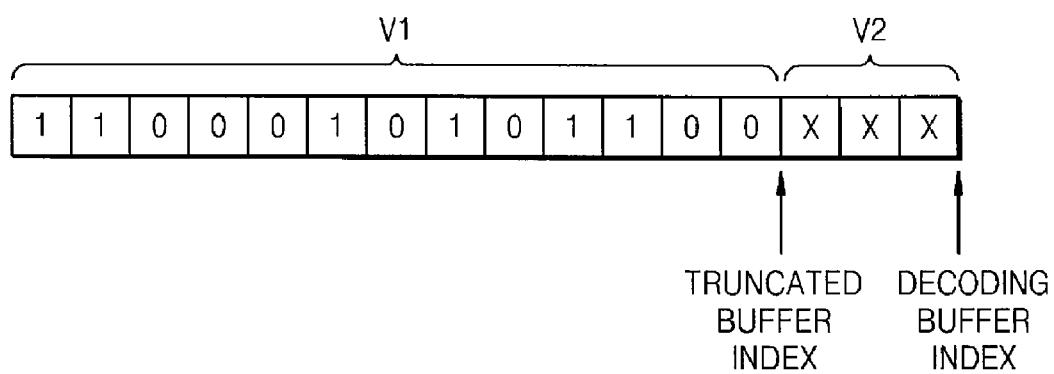
FIG. 4 illustrates values input into a buffer in a vicinity of a truncation point when a bitstream is truncated.

FIG. 4 illustrates values input into a buffer in a vicinity of a truncation point when a bitstream is truncated. Since meaningful information does not exist anymore in the bitstream located after a truncated buffer index, values allocated to the bitstream after the truncated buffer index are meaningless values. Here, the meaningless values are referred to as v2 bits, and values allocated to the rest of the buffers are referred to as v1 bits. In the present example, a v2 bit (dummy bit) has a value of 3, and the values of the v1 bits range from 0 to 7.

Figure 5:
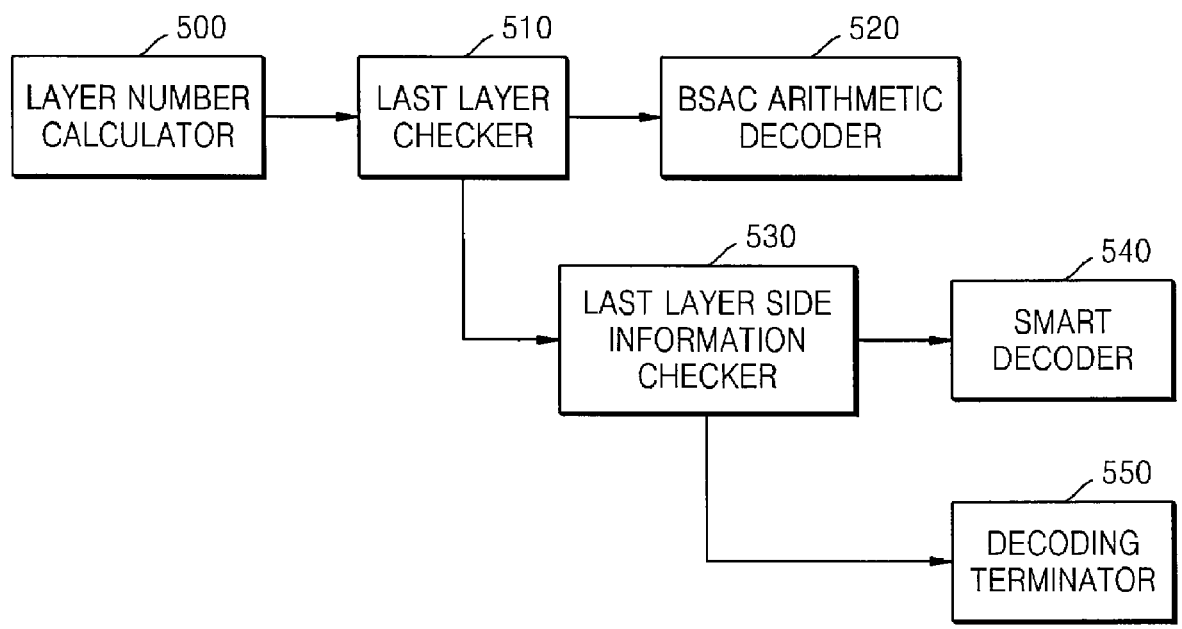
FIG. 5 is a block diagram illustrates a structure of a device to arithmetically decode scalable BSAC audio data according to an embodiment of the present general inventive concept.

FIG. 5 is a block diagram illustrating a structure of a device to arithmetically decode scalable BSAC audio data according to an embodiment of the present general inventive concept. The BSAC arithmetic decoding device includes a last layer side information checker 530, a smart decoder 540, and a decoding terminator 550.

The BSAC arithmetic decoding device may further include a layer number calculator 500, a last layer checker 510, and a BSAC arithmetic decoder 520. The layer number calculator 500 calculates a number of available layers of BSAC audio data by referring to a target bitrate.

The last layer checker 510 checks whether a layer of the BSAC audio data to be decoded is a last layer. The BSAC arithmetic decoder 520 performs BSAC arithmetic decoding when the layer of the BSAC audio data to be decoded is not the last layer according to a checking result. The last layer side information checker 530 checks whether all the side information of the last layer of the BSAC audio data is decoded. The smart decoder 540 performs BSAC smart decoding and then terminates the decoding when all the side information of the last layer is decoded.

When the smart decoder 540 performs BSAC smart decoding using information to be read after a truncation point of the truncated bitstream, it is checked whether a symbol to be decoded can be determined regardless of data read after the truncated bitstream. When decoding can be performed regardless of the data read after the truncated bitstream, the decoding is continued. When the symbol to be decoded can only be determined depending on the data read after the truncated bitstream, it is determined that an ambiguity occurs and the decoding is terminated.

The decoding terminator 550 terminates the decoding of the last layer when all the side information of the last layer is not decoded.

Figure 6:
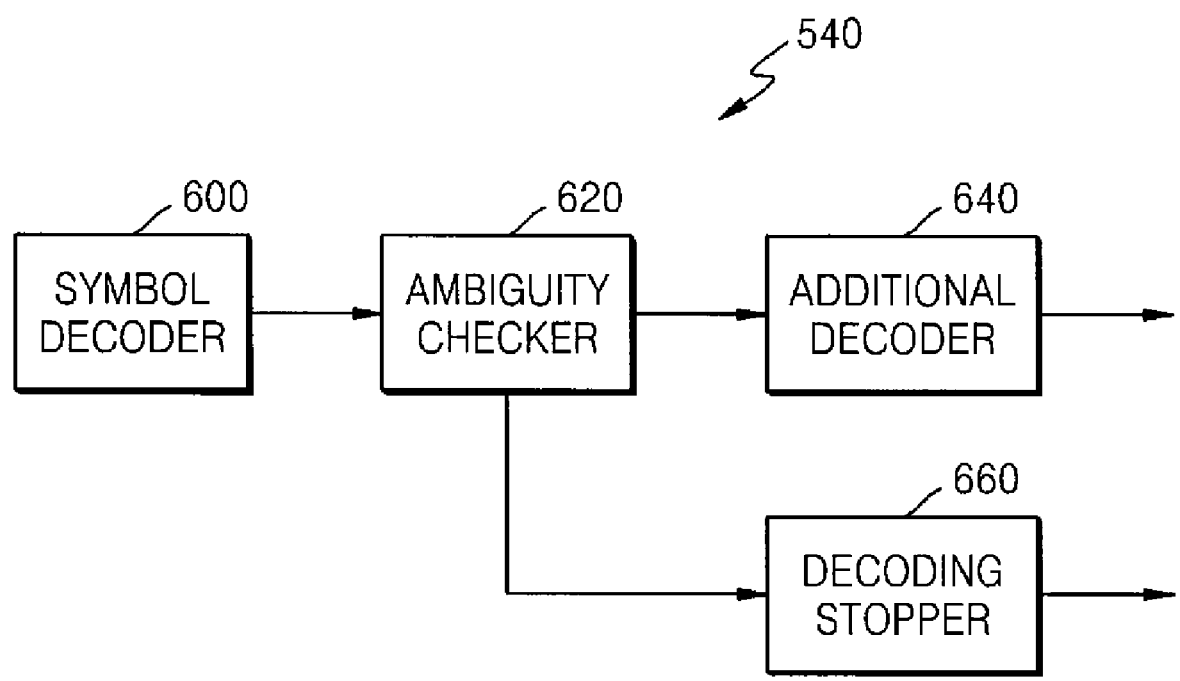
FIG. 6 is a block diagram illustrating a detailed structure of a smart decoder of FIG. 5.

FIG. 6 is a block diagram illustrating a detailed structure of the smart decoder 540 of FIG. 5. The smart decoder 540 includes a symbol decoder 600, an ambiguity checker 620, an additional decoder 640, and a decoding stopper 660.

The symbol decoder 600 performs arithmetic decoding by using a symbol and a probability of the symbol to be decoded. If right sides of Inequalities 1 and 2, provided below are equal to K, the ambiguity checker 620 checks whether an ambiguity occurs by calculating K. The additional decoder 640 decodes the symbol into 1 when K is equal to or greater than $2^{dummy}-1$. The additional decoder 640 decodes the symbol into 0 when K is equal to or less than 0.

$$v2 < \frac{(\text{high} - \text{low} + 1) \cdot \text{freq}}{2^{14}} - v1 + \text{low} - 1 \quad \text{Inequality 1}$$

$$v2 \geq \frac{(\text{high} - \text{low} + 1) \cdot \text{freq}}{2^{14}} - v1 + \text{low} - 1 \quad \text{Inequality 2}$$

In Inequalities 1 and 2, v1 is a valid bitstream value remaining after truncation occurs, v2 is a bitstream value that has been truncated after truncation occurs, "dummy" is a number of bits of the value v2, freq is a probability value of the symbol, and high and low are upper and lower ends, respectively, of a range in which the probability value of the symbol exists.

Hereinafter, Inequalities 1 and 2 will be described in detail. Referring back to FIG. 3, decoding inequalities of the pseudo code illustrated in FIG. 3 are rearranged with respect to the bitstream values v1 and v1 expressed in Inequalities 1 and 2, respectively.

If $(v1+v2-\text{low}+1) \times 2^{14} < (\text{high}-\text{low}+1) \times \text{freq}$, the symbol is decoded into 1. The aforementioned inequality becomes Inequality 1 by transposition with respect to the value v2.

In addition, if $(v1+v2-\text{low}+1) \times 2^{14} \geq (\text{high}-\text{low}+1) \times \text{freq}$, the symbol is decoded into 0. The aforementioned inequality becomes Inequality 2 by transposition with respect to the value v2.

In Inequality 1, the symbol is decoded into 1, regardless of the value v2, when the right side of Inequality 1 is greater than 7. In Inequality 2, the symbol is decoded into 0, regardless of the value v2, when K is less than 0. Otherwise, a decoding ambiguity occurs, and the decoding is terminated.

When the value K is between 0 and $2^{dummy}-1$, the decoding stopper 660 determines that the ambiguity occurs and stops the decoding. Particularly, for a sign bit, when the value K is between 0 and $2^{dummy}-1$, it is determined that the ambiguity occurs, and the previously decoded sample is set to 0.

A sign bit on a bitplane is decoded as follows. In MPEG-4 BSAC bitstream decoding, a first non-zero sample among values on the bitplane is decoded, and then, a sign corresponding to the sample is decoded. However, in a case where the decoding is terminated immediately when an ambiguity error occurs in a sign value, a sign of the previously decoded non-zero sample is unknown. Therefore, when the decoding is terminated in the sign value, the previously decoded sample is set to 0 and the decoding is terminated.

Figure 7:
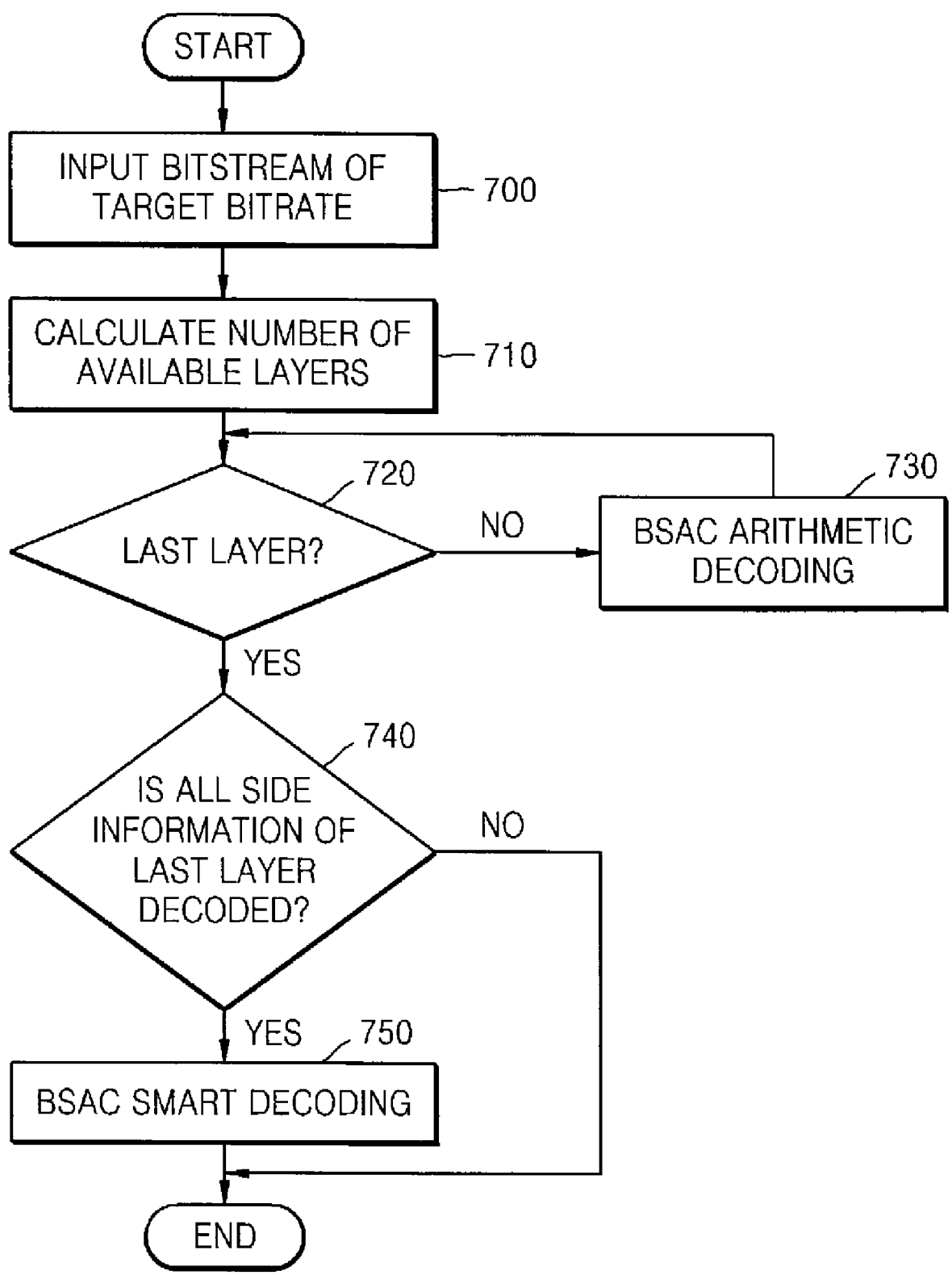
FIG. 7 is a flowchart illustrating a method for arithmetic decoding of BSAC scalable audio data according to another embodiment of the present general inventive concept.

FIG. 7 is a flowchart illustrating a method of arithmetic decoding of BSAC scalable audio data according to another embodiment of the present general inventive concept.

First, when a bitstream having a predetermined target bitrate is input (operation 700), the number of available layers of the BSAC audio data is calculated by referring to the target bitrate (operation 710). Then, it is checked whether the BSAC audio data layer to be decoded is the last layer (operation 720). When the BSAC audio data layer to be decoded is not the last layer, BSAC arithmetic decoding is performed (operation 730).

When the BSAC audio data to be decoded is the last layer, it is checked whether all side information of the last layer is decoded (operation 740). When all the side information of the last layer is decoded, BSAC smart decoding is performed (operation 750), and then, the decoding is terminated (END). When all the side information of the last layer is not decoded, the decoding of the last layer is terminated (END).

When BSAC smart decoding by the smart decoder is performed using information to be read after the truncated bitstream, it is checked whether the symbol to be decoded can be determined regardless of the data read after a truncated bitstream. When the decoding can be performed regardless of the data read after the truncated bitstream, there is no ambiguity and the decoding is continued. When a symbol to be decoded is determined to be dependent on the data read after the truncated bitstream, it is determined that an ambiguity occurs and the decoding is terminated.

A sign bit is decoded as follows. When the symbol to be decoded is determined to be dependent on the data read after the truncated bitstream, it is determined that an ambiguity occurs. Then, when the ambiguity occurs with respect to the sign bit, the previously decoded sample is set to 0 and the decoding is terminated.

Figure 8:
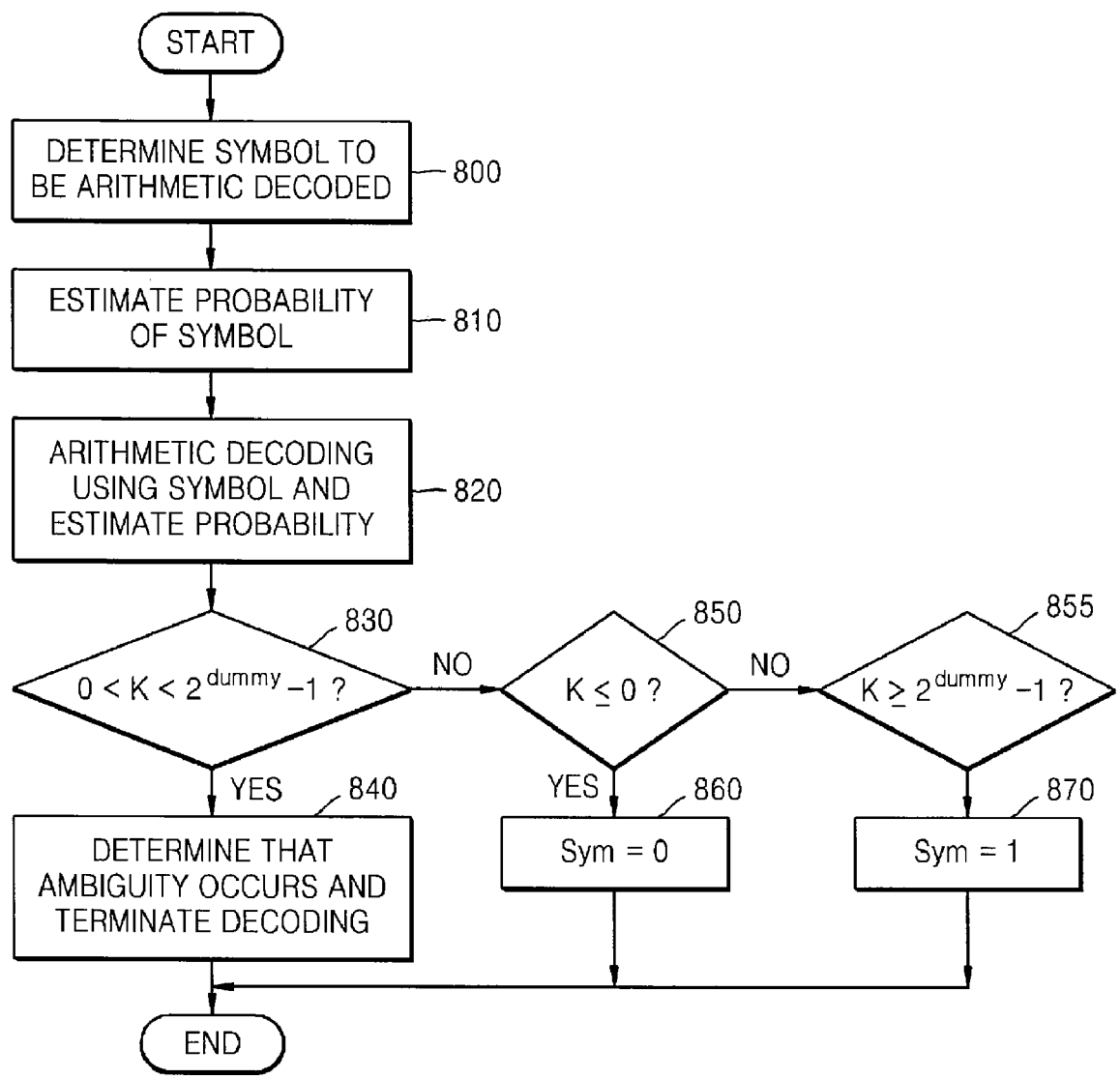
FIG. 8 is a flowchart illustrating an example of BSAC smart decoding of operation 750 of FIG. 7.

FIG. 8 is a flowchart illustrating an example of the BSAC smart decoding of operation 750. First, a symbol to be decoded is determined in an arithmetically coded scalable bitstream (operation 800), and a probability of the determined symbol is estimated (operation 810).

The symbol is arithmetically decoded using the symbol and the estimated probability (operation 820). Then, K, wherein K is equal to the right side values of Inequalities 1 and 2, is calculated. When K is between 0 and $2^{dummy}-1$ (operation 830), it is determined that an ambiguity occurs, and the arithmetic decoding is terminated (operation 840).

When K is equal to or less than 0 (operation 850), the symbol is decoded into 0, and when K is equal to or greater than $2^{dummy}-1$ (operation 855), the symbol is decoded into 1 (operation 870).

FIG. 9 illustrates an example in which additional decoding is performed by using a method of determining whether arithmetic decoding of a scalable BSAC bitstream is continuously performed or terminated. As illustrated in FIG. 9, six samples are additionally decoded.

In MPEG-4 BSAC decoding, a first non-zero sample among values on the bitplane is decoded and a sign corresponding to the sample is decoded. However, in a case where the decoding is terminated immediately when an ambiguity error occurs in a sign value, a sign of a previously decoded non-zero sample is unknown. Therefore, when the decoding is terminated in the sign value, the previously decoded sample is set to 0 and the decoding is terminated.

Figure 10:
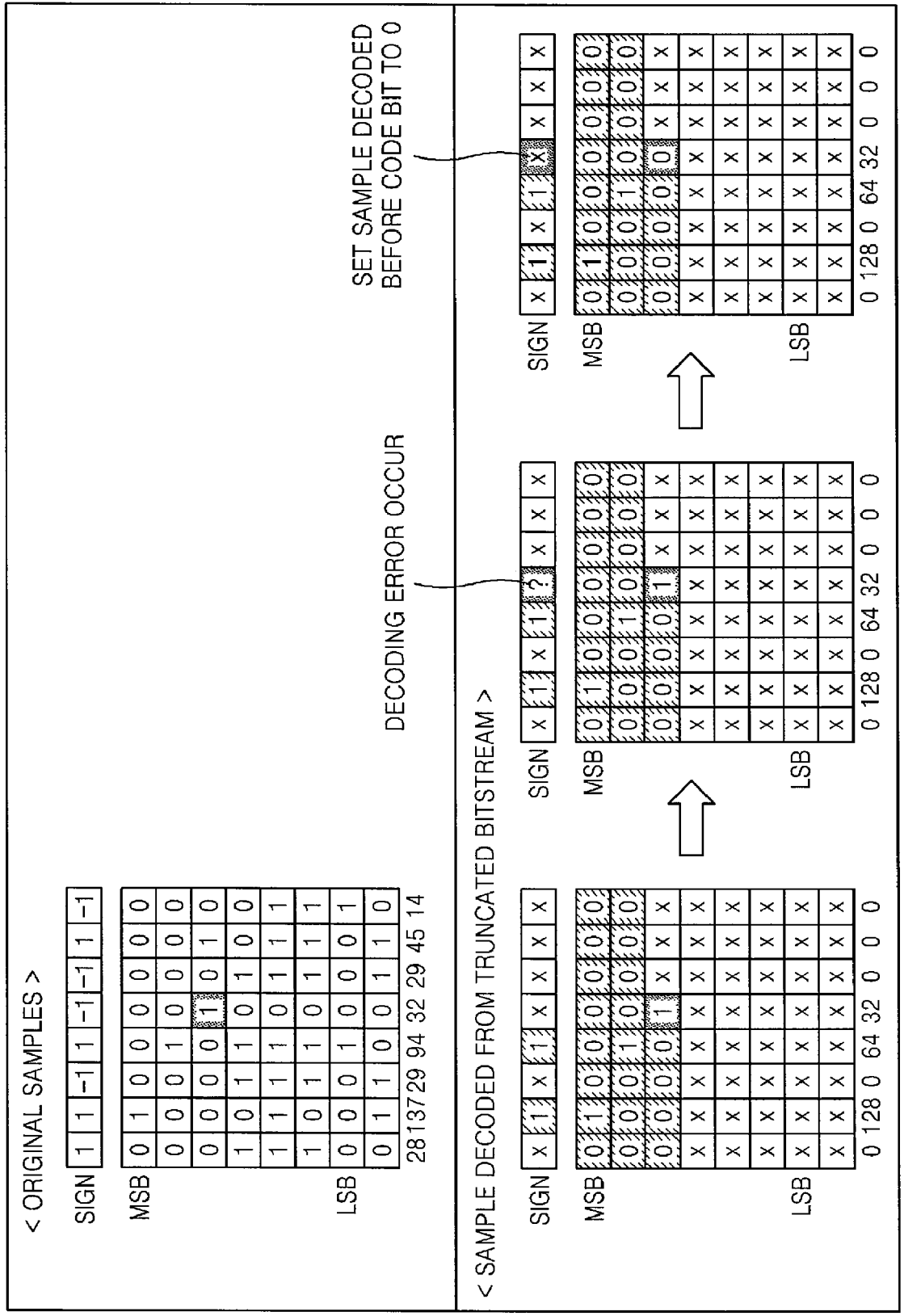
FIG. 10 illustrates an example of a process for the case when an ambiguity occurs in a sign bit.

FIG. 10 illustrates an example of a process performed when an ambiguity occurs in a sign bit.

The arithmetic decoding of a BSAC bitstream according to an embodiment of the present general inventive concept is an effective method of decoding an intermediate layer corresponding to a given target bitrate. This is based on the fact that meaningful information is still included in the decoding buffer even though there are not bits in the decoding buffer. The decoding is continued to a point where the ambiguity does not exist. The following pseudo code shows an algorithm to detect an ambiguity in an arithmetic decoding module. A variable num_dummy_bits denotes a number of bits which are not in a value buffer due to truncation.

```
int ambiguity_check(int freq)
    /* if there is no ambiguity, returns 1 */
    /* otherwise, returns 0           */
    upper = 1<<num_dummy_bits;
    decisionVal = ((high-low)*freq>>PRE_SHT)-value+low-1;
    if(decisionVal>upper || decisionVal<0) return 0;
    else return 1;
```

In order to prevent a sign bit error, a spectral value of a current spectral line is set to 0 when the ambiguity occurs while the sign bit is decoded. In the arithmetic decoding according to the embodiment of the present general inventive concept, all index variables are obtained from a previous arithmetic decoding process.

The general inventive concept can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices, and carrier waves (such as data transmission through the Internet). The computer-readable recording medium can also be distributed over network-coupled computer systems so that the computer-readable code is stored and executed in a distributed fashion. Also, functional programs, codes, and code segments to accomplish the present general inventive concept can be easily construed by programmers skilled in the art to which the present general inventive concept pertains. For example, the method illustrated in FIGS. 7 and 8 can be stored in the computer-recorded medium in a form of computer-readable codes to perform the method when the computer reads the computer-readable codes of the recording medium.

According to the methods and devices to arithmetically decode scalable BSAC audio data, byte level scalability can be provided in a MPEG-4 BSAC decoder. The decoding methods are effective in intermediate layers even at low transmission rates. Even though the bitstream is truncated, the decoding termination time can be known, and additional decoding with respect to a truncated portion of the bitstream can be performed.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of arithmetic decoding of scalable BSAC (bit sliced arithmetic coding) audio data, the method comprising:
    checking whether all side information of a last layer of the BSAC audio data is decoded; and
    performing BSAC smart decoding and terminating the decoding when all the side information of the last layer is decoded, and terminating the decoding of the last layer when all the side information of the last layer is not decoded,
    wherein the BSAC smart decoding comprises:
    checking whether a symbol to be decoded can be determined regardless of data read after a truncated bitstream;
    continuing decoding when decoding can be performed regardless of the data read after the truncated bitstream; and
    determining that an ambiguity occurs and terminating the decoding, when the symbol to be decoded is determined to be dependent on the data read after the truncated bitstream.

2. The method of claim 1, wherein the BSAC smart decoding further comprises:
    performing arithmetic decoding using a symbol to be decoded and a probability of the symbol;
    decoding the symbol into 1 by calculating K and determining whether K is equal to or greater than $2^{dummy}-1$, wherein K is equal to right side values of Inequalities 1 and 2, and otherwise, decoding the symbol into 0 when K is equal to or less than 0, $$v2 < \frac{(high - low + 1) \cdot freq}{2^{14}} - v1 + low - 1 \quad \text{Inequality 1}$$

$$v2 \geq \frac{(high - low + 1) \cdot freq}{2^{14}} - v1 + low - 1 \quad \text{Inequality 2}$$

wherein, v1 is a valid bitstream value remaining after truncation, v2 is a bitstream value truncated after truncation, dummy is a number of bits of the value v2, freq is a probability value of the symbol, high and low are upper and lower ends of a range in which the probability value of the symbol exists; and
    stopping the decoding by determining that the ambiguity occurs when the value K is between 0 and $2^{dummy}-1$.

3. The method of claim 1, wherein the determining that the ambiguity occurs and terminating the decoding comprises:
    determining that the ambiguity occurs when the symbol to be decoded is determined to be dependent on the data read after the truncated bitstream; and
    setting a previously decoded sample to 0 and terminating the decoding when it is determined that the ambiguity occurs with respect to a sign bit.

4. The method of claim 1, wherein the checking whether all side information is to be decoded comprises:
    calculating a number of available layers of the BSAC audio data by referring to a target bitrate; and
    checking whether a BSAC audio data layer to be decoded is the last layer and performing BSAC arithmetic decoding when the BSAC audio data layer to be decoded is not the last layer.

5. A method of arithmetically decoding scalable BSAC (bit sliced arithmetic coding) audio data, the method comprising:
    determining whether a BSAC audio data layer to be decoded is a last layer and performing BSAC arithmetic decoding when the BSAC audio data layer to be decoded is not the last layer;
    checking whether all side information of a last layer of the BSAC audio data is decoded when the BSAC audio data layer to be decoded is determined to be the last layer; and
    performing BSAC smart decoding and then terminating the decoding when all the side information of the last layer is decoded, otherwise terminating the decoding of the last layer when all the side information of the last layer is not decoded.

6. The method of claim 5, wherein performing the BSAC smart decoding comprises:
    arithmetically decoding a symbol of the BSAC audio data;
    determining a probability of the symbol;
    determining if an ambiguity occurs in the arithmetically decoded symbol based on the probability of the symbol;
    stopping decoding if an ambiguity is determined to occur; and
    determining a symbol value to be 1 or 0 if an ambiguity is determined not to occur.

7. A method of decoding a bitstream of BSAC (bit sliced arithmetic coding) audio data, the method comprising:
    determining whether all side information of the bitstream of BSAC audio data is decoded;
    smart decoding the bitstream of BSAC audio data when all the side information is decoded, the smart decoding comprising:
    arithmetically decoding a symbol of the bitstream;
    determining a probability of the symbol;
    determining if an ambiguity occurs in the arithmetically decoded bitstream symbol based on the probability of the symbol;
    stopping decoding if an ambiguity is determined to occur; and
    determining a bitstream symbol value if an ambiguity is determined not to occur.

8. The method of claim 7, wherein the smart decoding further comprises:
    determining the bitstream symbol value to be a value of 0 or 1 based on the probability of the symbol and additional bitstream information.

9. The method of claim 8, wherein the additional bitstream information comprises information of a number of dummy bits in the BSAC data.

10. A device to arithmetically decode scalable BSAC (bit sliced arithmetic coding) audio data, the device comprising:
    a side information checker to check whether all side information of a last layer of the BSAC audio data is decoded;
    a smart decoder to perform BSAC smart decoding and to terminate the decoding when all the side information of the last layer is decoded; and
    a decoding terminator to terminate the decoding of the last layer when all the side information of the last layer is not decoded, wherein the BSAC smart decoding of the smart decoder continues the decoding when a symbol to be decoded can be decoded regardless of the data read after a truncated bitstream by checking whether the symbol to be decoded is determined regardless of data read after the truncated bitstream, and otherwise, terminates the decoding by determining that an ambiguity occurs when the symbol to be decoded is determined to be dependent on the data read after the truncated bitstream.

11. The device of claim 10, wherein the smart decoder comprises:
a symbol decoder to perform arithmetic decoding using the symbol to be decoded and a probability of the symbol;
an ambiguity checker to check whether the ambiguity occurs by calculating K, wherein K is equal to right side values of Inequalities 1 and 2;
an additional decoder to decode the symbol into 1, when K is equal to or greater than $2^{dummy}-1$, and otherwise, decoding the symbol into 0, when K is equal to or less than 0, $$v2 < \frac{(high - low + 1) \cdot freq}{2^{14}} - v1 + low - 1 \quad \text{Inequality 1}$$

$$v2 \geq \frac{(high - low + 1) \cdot freq}{2^{14}} - v1 + low - 1 \quad \text{Inequality 2}$$

wherein, v1 is a valid bitstream value remaining after truncation, v2 is a bitstream value truncated after truncation, dummy is a number of bits of the value v2, freq is a probability value of the symbol, high and low are upper and lower ends of a range in which the probability value of the symbol exists; and
a decoding stopper to stop the decoding by determining that the ambiguity occurs, when K is between 0 and $2^{dummy}-1$.

12. The device of claim 11, wherein the decoding stopper determines that the ambiguity occurs, when K is between 0 and $2^{dummy}-1$, and sets a previously decoded sample to 0.

13. The device of claim 11, further comprising:
a layer number calculator to calculate a number of available layers of the BSAC audio data by referring to a target bitrate;
a last layer checker to check whether the BSAC audio data layer to be decoded is the last layer; and
a BSAC arithmetic decoder performing BSAC arithmetic decoding when the BSAC audio data layer is not the last layer based on the checking result.

14. A computer-readable recording medium having embodied thereon a computer program to execute a method of arithmetic decoding of scalable BSAC (bit sliced arithmetic coding) audio data, the method comprising:
checking whether all side information of a last layer of the BSAC audio data is decoded; and
performing BSAC smart decoding and terminating the decoding when all the side information of the last layer is not decoded, and terminating the decoding of the last layer when all the side information of the last layer is decoded,
wherein the BSAC smart decoding comprises:
checking whether a symbol to be decoded can be determined regardless of data read after a truncated bitstream;
continuing decoding when decoding can be performed regardless of the data read after the truncated bitstream; and
determining that an ambiguity occurs and terminating the decoding, when the symbol to be decoded is determined to be dependent on the data read after the truncated bitstream.

15. A computer-readable recording medium having embodied thereon a computer program to execute a method of decoding of BSAC (bit sliced arithmetic coding) audio data, the method comprising:
determining whether a BSAC audio data layer to be decoded is a last layer and performing BSAC arithmetic decoding when the BSAC audio data layer to be decoded is not the last layer;
checking whether all side information of a last layer of the BSAC audio data is decoded when the BSAC audio data layer to be decoded is determined to be the last layer; and
performing BSAC smart decoding and then terminating the decoding when all the side information of the last layer is decoded, and otherwise terminating the decoding of the last layer when all the side information of the last layer is not decoded.

* * * * *